US010007017B2

(12) United States Patent
Stothers et al.

(10) Patent No.: US 10,007,017 B2
(45) Date of Patent: Jun. 26, 2018

(54) SENSOR CORE AND SENSOR

(71) Applicant: Ultra Electronics Limited, Greenford, Middlesex (GB)

(72) Inventors: Ian McGregor Stothers, Saham Toney (GB); Mark Alan McCray, Round Rock, TX (US)

(73) Assignee: Ultra Electronics Limited, Greenford (GB)

( * ) Notice: Subject to any disclaimer, the term of this patent is extended or adjusted under 35 U.S.C. 154(b) by 493 days.

(21) Appl. No.: 14/542,305

(22) Filed: Nov. 14, 2014

(65) Prior Publication Data

US 2016/0139286 A1    May 19, 2016

(51) Int. Cl.
  *G01V 3/10*   (2006.01)
  *H03K 17/95*  (2006.01)
  *H01F 3/14*   (2006.01)

(52) U.S. Cl.
  CPC .............. *G01V 3/10* (2013.01); *H01F 3/14* (2013.01); *H03K 17/9505* (2013.01)

(58) Field of Classification Search
  CPC ...... G01D 5/142; G01D 5/145; G01D 5/2033; G01D 5/2241; G01B 5/0011; G01B 9/02058; G01B 7/00; G01B 7/14; G01B 7/30; G01B 7/287; G01B 7/312; G01B 7/315; G01C 15/14; G01J 1/4228; G01R 33/02; B60W 2420/506; H01F 13/003; H01F 17/0006; H01F 41/00; H01F 41/005; H01F 41/02; H01F 41/0206; H01F 41/0213; H01F 41/022; H01F 41/0226; H01F 41/0233; H01F 41/024; H01F 41/0246; H01F 41/10; H01F 41/12; H01F 41/122
  USPC ................... 324/207.11–207.17, 207.2, 253; 29/602.1, 603.01, 603.07, 607
  See application file for complete search history.

(56) References Cited

U.S. PATENT DOCUMENTS

| 4,219,740 A | 8/1980 | Little |
| 4,426,616 A | 1/1984 | Maier |
| 4,845,429 A | 7/1989 | Burreson |

(Continued)

FOREIGN PATENT DOCUMENTS

| EP | 0 538 037 A2 | 10/1992 |
| EP | 0 880 035 A2 | 11/1998 |

(Continued)

*Primary Examiner* — Tung X Nguyen
*Assistant Examiner* — Robert P Alejnikov, Jr.
(74) *Attorney, Agent, or Firm* — Blank Rome LLP

(57) ABSTRACT

A proximity sensor core for a proximity sensor is provided. The core has a head portion extending across a width of the sheet of material and the head has a first length. First and second leg portions extend for a second length from the same edge of the head portion. Each of the first and second leg portions extend across a portion of the width of the head portion. First and second foot portions extend for a third length from the respective first and second leg portions. The first and second foot portions have the same width as the respective leg portions. The core has a first bend between each of the first and second foot portions and the respective first and second leg portions so that the first and second foot portions extend generally perpendicular to the respective first and second leg portions.

30 Claims, 19 Drawing Sheets

(56) References Cited

U.S. PATENT DOCUMENTS

| | | | |
|---|---|---|---|
| 5,285,154 | A | 2/1994 | Burreson |
| 5,331,277 | A | 7/1994 | Burreson |
| 5,351,004 | A | 9/1994 | Daniels et al. |
| 5,410,488 | A | 4/1995 | Andersen, III |
| 5,488,566 | A | 1/1996 | Woolsey |
| 5,912,829 | A | 6/1999 | Maier |
| 6,424,145 | B1 | 7/2002 | Woolsey et al. |
| 6,507,189 | B2 | 1/2003 | Woolsey et al. |
| 7,129,701 | B2 | 10/2006 | LaClair |
| 7,262,595 | B2 | 8/2007 | Rudd, III |
| 7,355,392 | B2 | 4/2008 | LaClair et al. |
| 2001/0019262 | A1* | 9/2001 | Woolsey .............. G01B 7/023 324/207.26 |
| 2002/0077752 | A1 | 6/2002 | Burreson et al. |
| 2006/0103372 | A1 | 5/2006 | LeClair |
| 2009/0080106 | A1* | 3/2009 | Shimizu .............. G11B 5/314 360/75 |
| 2014/0002061 | A1* | 1/2014 | Giroud .............. G01B 7/023 324/202 |
| 2014/0266541 | A1* | 9/2014 | Sakamoto .............. H01F 27/29 336/192 |
| 2014/0266558 | A1* | 9/2014 | Catalano .............. H01F 3/14 336/233 |

FOREIGN PATENT DOCUMENTS

| | | |
|---|---|---|
| EP | 1 264 404 B1 | 2/2001 |
| WO | WO 01/65695 A2 | 9/2001 |
| WO | WO 02/27354 A2 | 4/2002 |

\* cited by examiner

SENSOR CORE AND SENSOR

FIELD OF THE INVENTION

The present invention relates to sensor core for a sensor, and a sensor. In particular, the present invention relates to a sensor core for a proximity sensor for creating a magnetic field for sensing a proximity of a target, and also to a sensor incorporating such a sensor core.

BACKGROUND OF THE INVENTION

A proximity sensor is a device used to detect the presence of an object, for example a metallic object or ferrous object. There are a number of principals of operation used in proximity sensors, for example, variable reluctance, eddy current loss, saturated core, and Hall affect.

Saturated core sensors, for example, include a core made from a material that will magnetically saturate when exposed to a magnetic field of a certain flux density. As a magnetic object is moved towards the core assembly, a distance is reached where the magnetic field of the object finds the core to be the smallest reluctance path. As a result, the flux of the filed enters the core and, as the distance is decreased the flux density increases and eventually saturates the core. The saturation of the core causes the impedance of the coil to decrease. By measuring changes in the impedance of the coil, the presence for the magnetic object may be detected.

FIGS. 1 and 2 show an example prior art proximity sensor and FIG. 3 shows an example of a core used in the proximity sensor of FIGS. 1 and 2. FIGS. 1 to 3 will now be described.

The proximity sensor 100 includes a housing having a target-facing front sensor surface 104 and four side walls 106 extending at right angles from the surface 104. The side walls 106 and front sensor surface 104 form a hollow interior region in the housing 102. A sensing region 200 extends out from the target-facing front sensor surface 104 in a generally hemispherical shape.

In this prior art example, the housing 102 includes two flanges 108 extending outward from the opposite side walls 106. The flanges 108 have apertures 110 to permit the proximity sensor 100 to be mounted on a support member (not shown). The housing 102 may be made from a non-magnetic material having a fairly low electrical conductivity. An external connector 140 is provided to enable external connection to the internal electrical components.

A core 120 is located in the housing 102 and is used to generate the magnetic fields needed to sense target. The core 120 is preferably constructed from a highly permeable material such as soft iron, cast iron, transformer steel, or any other like materials. The material preferably has a relatively high permeability (for example in excess of 10,000). In the prior art proximity sensor shown in FIGS. 1 to 3, the core 120 comprises a substantially flat, rectangular member bent in four locations to form a shape having a head portion 220, two leg portions 222, and two foot portions 224. The head portion 220 is perpendicular to the two legs 222, and the two legs are perpendicular to the two feet 224. The two feet 224 are parallel to each other and coplanar extending oppositely from the respective legs.

The coil assemblies 118 are provided (one coil assembly per leg and foot) through which current is passed to create the magnetic field in combination with the core 120.

SUMMARY OF THE INVENTION

However, we have appreciated a need for alternative core designs and alternative proximity sensors that may have improved sensitivity and other desirable characteristics.

The present invention therefore provides a sensor core for a sensor for creating a magnetic field for sensing a proximity of a target, the core comprising: a sheet of high relative permeability material having a thickness that is less than a width and length of the sheet of material, and the core comprising: a head portion extending across a width of the sheet of material and having a first length; first and second leg portions extending a second length from a first edge of the head portion, each of the first and second leg portions extending across a portion of the width of the head portion; and first and second foot portions extending a third length from the respective first and second leg portions, the first and second foot portions having the same width as the respective leg portions, wherein the sheet of material comprises a first bend between each of the first and second foot portions and the respective first and second leg portions such that the first and second foot portions extend generally perpendicular to the respective first and second leg portions.

By having each of the leg portions extending from the same edge, a compact sensor core may be provided.

The first and second foot portions may extend generally parallel to each other and 180° apart from one another.

The sensor core may also comprise a second bend between each of the respective first bends and the respective first and second legs, wherein the first bend is at an obtuse angle and the second bend is at an acute angle such that the respective first and second leg portions extend over and generally perpendicular to the respective first and second foot portions. Such a design provides a compact core design.

The first bend may have a width that is narrower than the width of the respective first or second leg portions, and the first bend has a fourth length. The first bend may be formed from a cut-out portion of the respective first and second foot portions. In this design, the first bend extends from the respective first and second foot portion such that the respective first and second leg portions extend over and generally perpendicular to the respective first and second foot portions.

The cut-out in the first and second foot portions may provide the first bend and defines a gap between two end portions in each of the first and second foot portions.

Each of the first bends and/or lower portions of each of the first and second leg portions are adapted to receive a respective coil wound there-around for generating a magnetic field when a current is passed there-through.

The width of the leg portions narrows along at least a portion of the second length. This may provide an area for receiving coils wound there-around.

The sheet of material may comprise a third bend between each of the first and second leg portions and the head portion such that the head portion extends along an axis that is generally perpendicular to the respective first and second leg portions. This may provide a compact core design.

The head may extend generally parallel to and over at least a portion of one or both of the foot portions.

The sensor core may comprise a fourth bend between each of the respective third bends and the respective first and second legs, wherein the third bend is at an obtuse angle and the fourth bend is at an acute angle such that the respective first and second leg portions extend beneath and generally perpendicular to the head portion.

The head portion may comprise one or more openings for receiving a coil former or bobbin.

The present invention also provides a sensor for sensing the proximity of a target, the sensor comprising: a case having a flat rectangular sensor face, side walls and a lid; and a sensor core as described above, located inside the case, wherein the first and second foot portions of the proximity sensor core are adjacent the inside surface of the flat rectangular sensor face and arranged to extend transverse the shorter dimension of the rectangular sensor face.

The sensor may comprise a first and second plurality of coils wound around respective first bends and/or lower portions of the respective first and second leg portions.

The sensor may also comprise a conductive shield arranged to shield one or more sides of the case except for the rectangular sensor face. With such a shield, this may decrease the proximity sensor's sensitivity to other objects (e.g. metal objects) approaching the sensor from directions other than the sensor face.

The above sensor may be a proximity sensor.

BRIEF DESCRIPTION OF THE DRAWINGS

The present invention will now be described, by way of example only, and with reference to the accompanying figures, in which.

DETAILED DESCRIPTION OF THE PREFERRED EMBODIMENTS

In brief, we describe a number of alternative cores for a proximity sensor. The basic design comprises a core that is made from a sheet of high permeability material that has a thickness that is less than a width and length of the sheet of material. The sheet of material is cut or shaped such that it has a head portion extending across a width of the sheet of material and the head has a first length. First and second leg portions extend for a second length from the same edge of the head portion. Each of the first and second leg portions extend across a portion of the width of the head portion (the head and leg portions may be described as having an upside down "U" shape). Additionally, first and second foot portions extend for a third length from the respective first and second leg portions. The first and second foot portions have the same width as the respective leg portions In the basic design, the sheet of material comprises a first bend between each of the first and second foot portions and the respective first and second leg portions so that the first and second foot portions extend generally perpendicular to the respective first and second leg portions. Alternative designs have variations in the position of the head, or where the first bend is relative to the foot.

Figure 4:
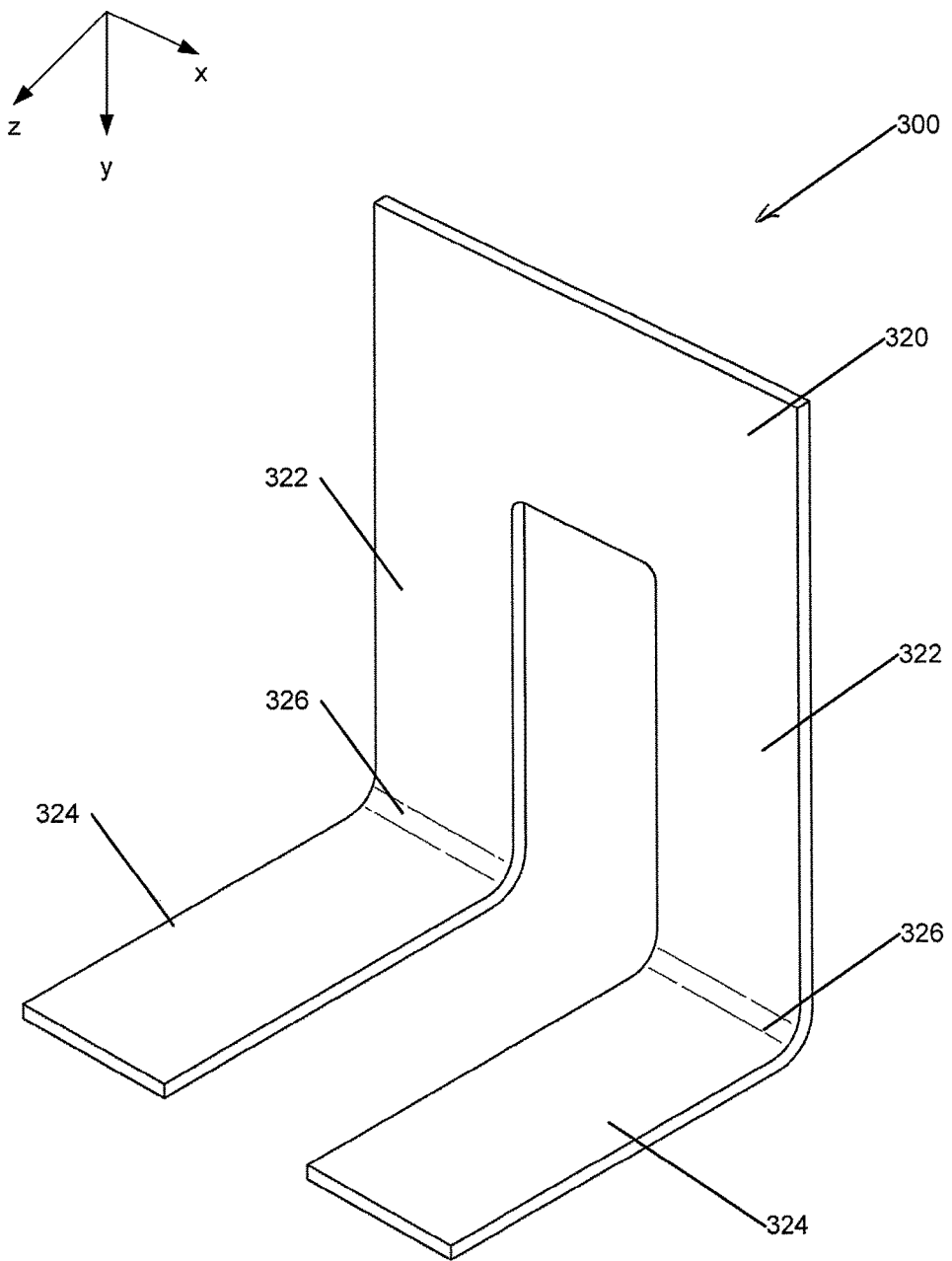
FIG. 4 shows a first proximity core design according to the invention.

FIG. 4 shows a first proximity core design according to the invention. The core (300) is preferably made from a single sheet of material having a high relative permeability that is cut and/or bent or folded to form the preferred shape. One example material that may be used to form the core is referred to in the art as HyMu "80" (manufactured by Carpenter Steel Company), which is an unoriented, 80% nickel-iron-molybdenum alloy which offers extremely high initial permeability as well as maximum permeability with minimum hysteresis loss. Other suitable materials include Permalloy.

The sheet of material has a thickness, a width and a length. The thickness is preferably approximately 0.020" (0.51 mm), which is less than the width and the length of the sheet of material.

The core (300) comprises a head portion (320), two leg portions (322) and a foot portion (324) extending from each of the leg portions (322). The head portion (320) extends across a width of the sheet of material, and has a first length. Each of the leg portions (322) extend a second length from the same edge of the head portion (320), and each of the first and second leg portions (322) extend across a portion of the width of the head portion (320). Since each of the leg portions extend a portion of the width of the head portion (320), a gap is found between the leg portions (322).

Each of the first and second foot portions (324) extend a third length from the respective first and second leg portions (322). The foot portions (324) have the same width as the respective leg portions (322).

Between each of the leg portions (322) and foot portions (324) is provided a first bend (326). As such, the respective first and second foot portions (324) extend generally perpendicular (322) from the respective first and second leg portions.

When inserted into proximity sensor device (for example in the device shown in FIGS. 1 and 2), the feet extend along at least a portion of the front sensor surface (104) in the z-axis. Preferably, the foot portions (324) extend along a substantial length (in the z-axis) of the front sensor surface (104).

In order to create the magnetic field, first and second coils (not shown) are wound around each of the respective first and second leg portions (322). This may be provided by the coils being wound directly around the core legs portions (322). Alternatively, the coils are pre-wound around formers or carriers through which the legs portions (322) extend (see for example the coils provided in the prior art device of FIG. 2). Preferably the coils are located at lower portions (towards the foot portions (324)) of the leg portions (322) in order to minimise the flux coupling with the head portion (320), which may affect the sensitivity of the device.

A limitation with the design of the core of FIG. 4 is that one must leave sufficient gap behind leg portions (322) such that the coils may be wound and the core and coils placed in a proximity sensor device without the core and coils touching the inside of the device casing.

Figure 5:
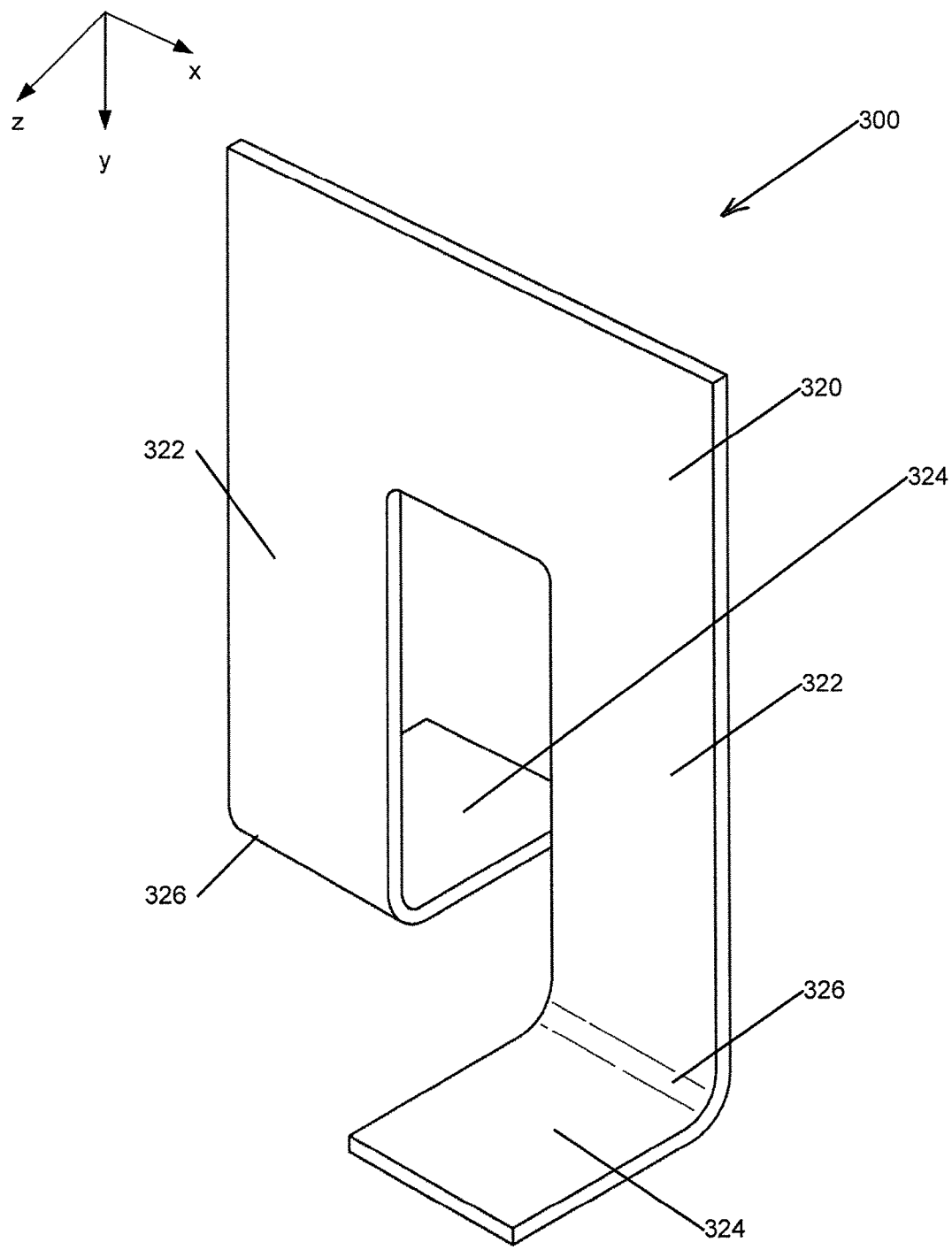
FIG. 5 shows the first proximity core design of FIG. 4 with a different configuration of the feet.

FIG. 5 shows an alternative version of the core of FIG. 4. In the core shown in FIG. 5, the head (320) and leg portions (322) are the same as in FIG. 4. However, in in FIG. 5, the first and second foot portions (324) extend in directions that are parallel to each other, and approximately 180° apart from one another.

In such an embodiment, the length of each of the foot portions (324) is reduced compared to the length of the foot portions (324) the core design shown in FIG. 4. However, since the foot portions extend in opposite directions, it can be seen that the leg portions (322) extending upwardly and generally perpendicular from the foot portions (324) centrally between the extremes of the foot portions (324). As such, there is a larger gap behind the leg portions (322) compared to the design shown in FIG. 4, around which there is greater space for the coils to be wound around the leg portions (322) without touching the inside of the device casing.

Figure 6:
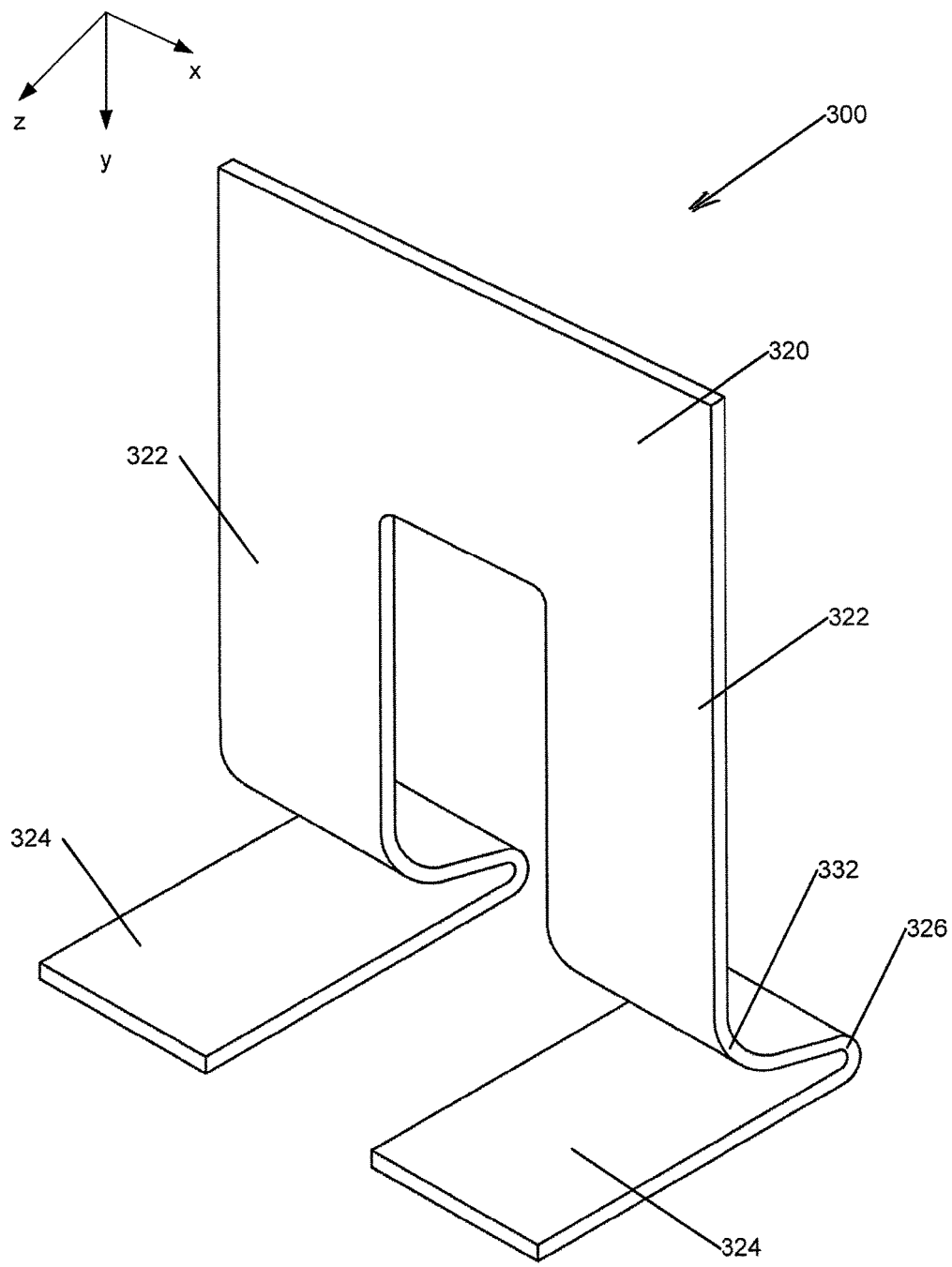
FIG. 6 shows a second proximity core design according to the invention.

FIG. 6 shows an alternative core design to those of FIGS. 4 and 5. In this design, the head portion (320) and upper portions (adjacent the head portion (320)) of the first and second leg portions (322) are substantially the same as with FIGS. 4 and 5. However, in FIG. 6, the bends between the leg portions (322) and the foot portions (324) differ.

The core design in FIG. 6 comprises a first bend (326) at one end of the respective foot portions (324) that is bent at an obtuse angle (that is, an angle beyond the 90° angle created with the first bend shown in FIGS. 4 and 5). This first bend (326) is followed by a second bend (332) between the first bend (326) and the leg portion (322). The second bend (332) is at an acute angle such that the leg portion (322) extending away from the second bend toward the head portion (320) extends perpendicularly away from the foot portion (324). By virtue of the first (326) and second bends (332), the leg portions (322) therefore extend over, and perpendicularly away from, the foot portions (324). This arrangement therefore provides a gap behind the leg portions (322) to provide space for the coils to be wound around the leg portions (322) without touching the proximity device case when assembled therein.

Figure 7:
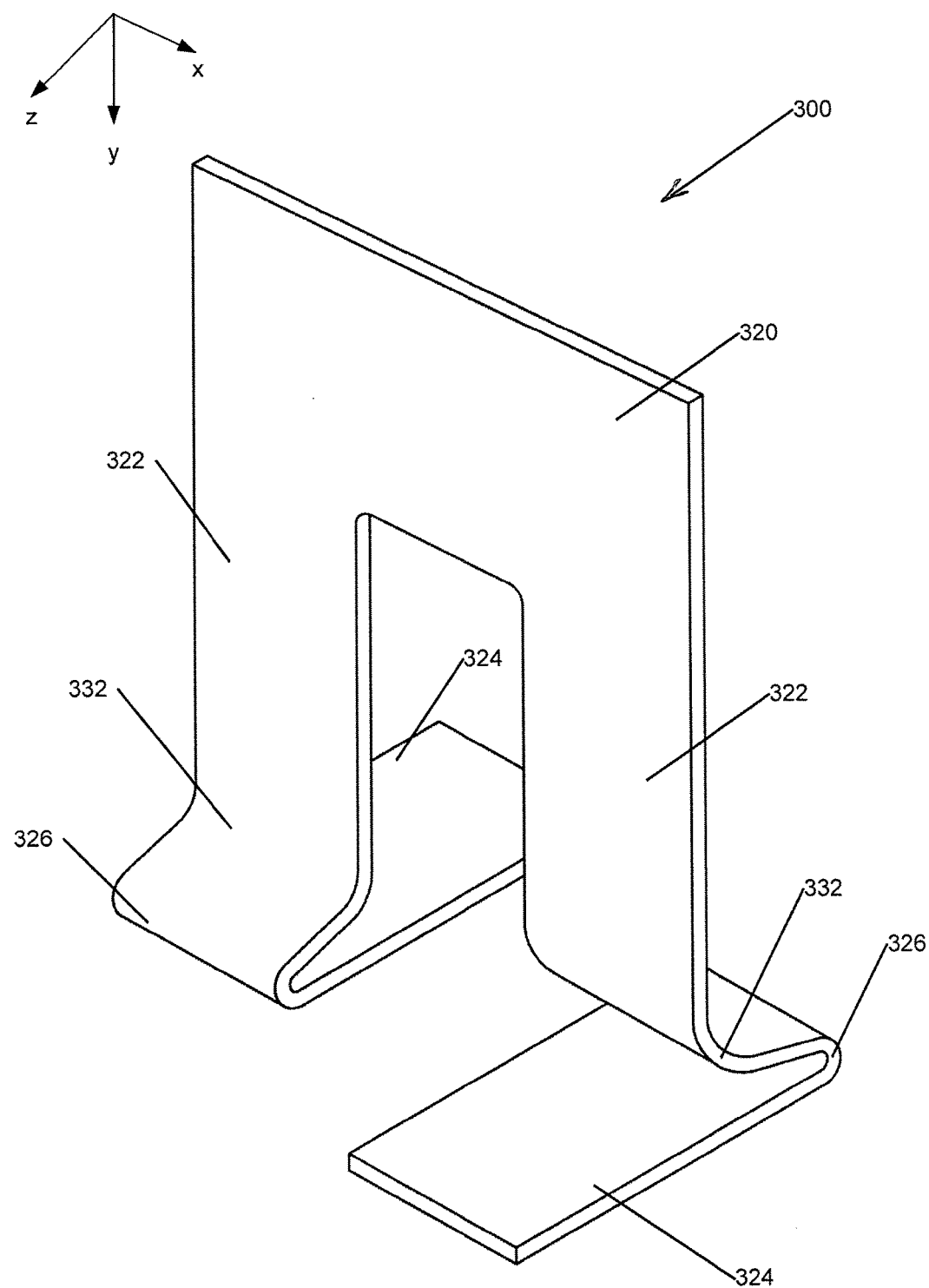
FIG. 7 shows the second proximity core design of FIG. 6 with a different configuration of the feet.

FIG. 7 shows an alternative version of the core of FIG. 6. In the core shown in FIG. 7, the head (320) and leg portions (322) are the same as in FIG. 6. However, in in FIG. 7, the first and second foot portions (324) extend in directions that are parallel to each other, and approximately 180° apart from one another.

Figure 8A:
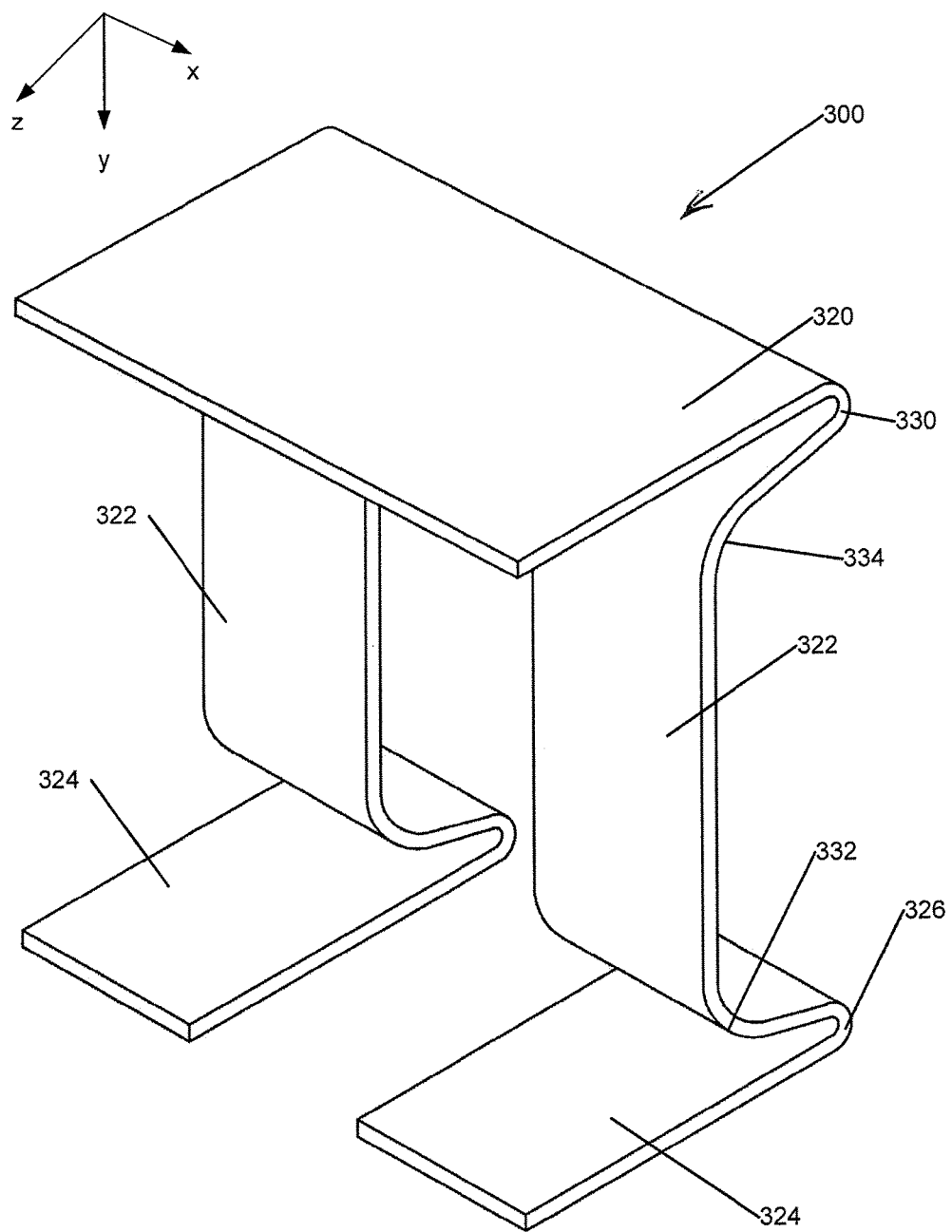
FIGS. 8a and 8b show the second proximity core design of FIG. 6 with a different head configuration.
Figure 8B:
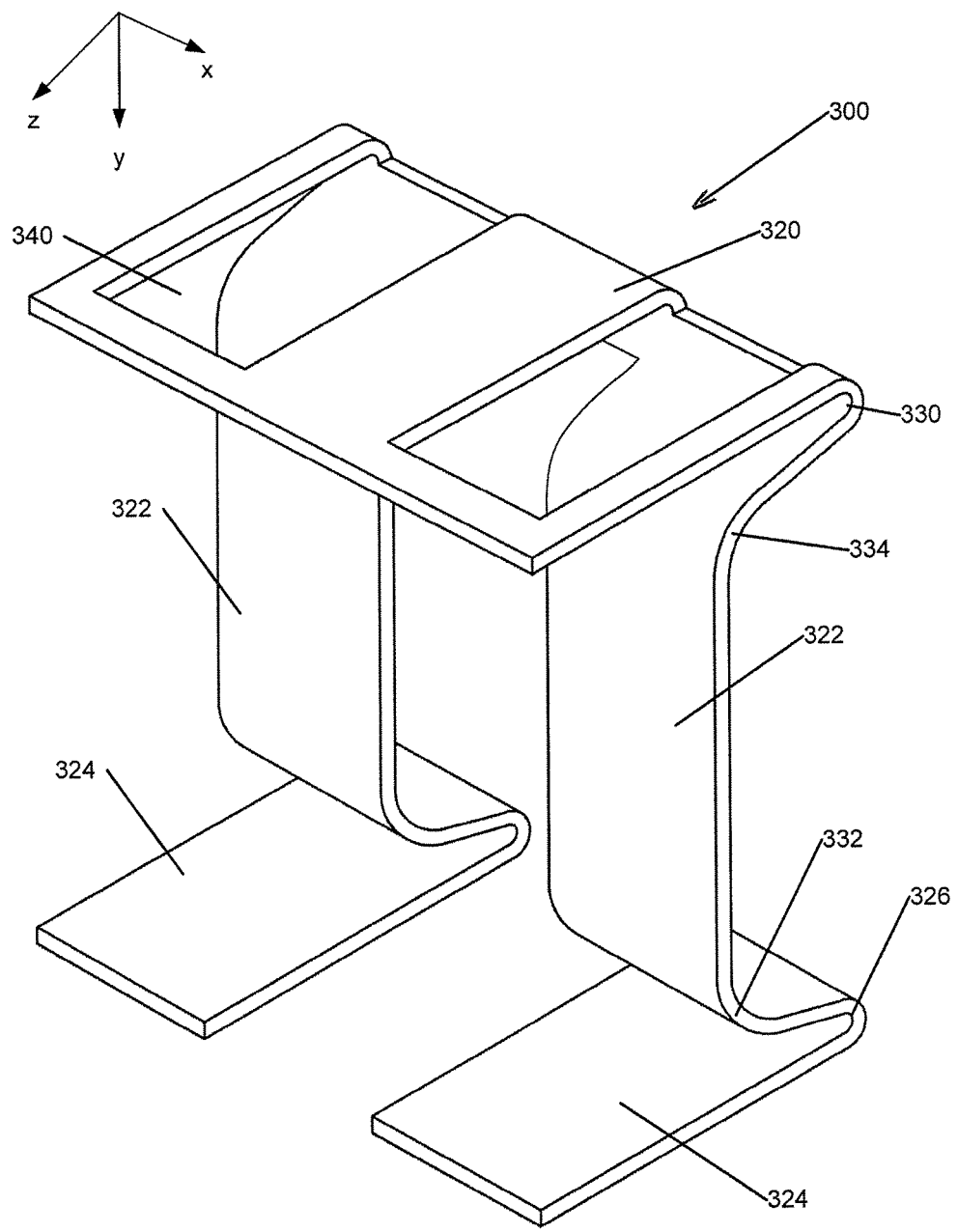

FIGS. 8a and 8b show an alternative version of the core of FIG. 6. In the core shown in FIG. 8a, the core comprises a third bend (330) adjacent the head portion (320) and a fourth bend (334) between the third bend (330) and the leg portions (322). In this arrangement, the third bend (330) is at an obtuse angle, and the fourth bend (334) is at an acute angle. In this configuration, the head portion (320) extends along an axis that is generally perpendicular to the respective leg portions (322) (which extend beneath the head portion (320)), and generally parallel to and over at least a portion of one or both of the foot portions (324).

Figure 1:
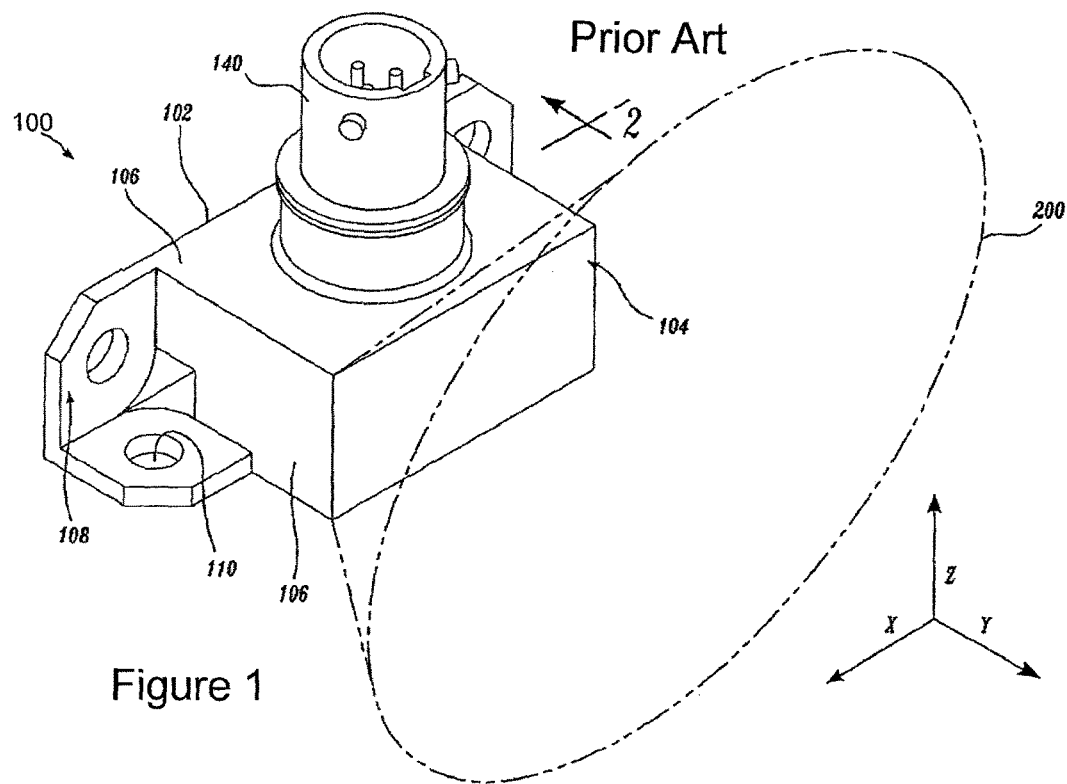
FIG. 1 shows a prior art proximity sensor.
Figure 2:
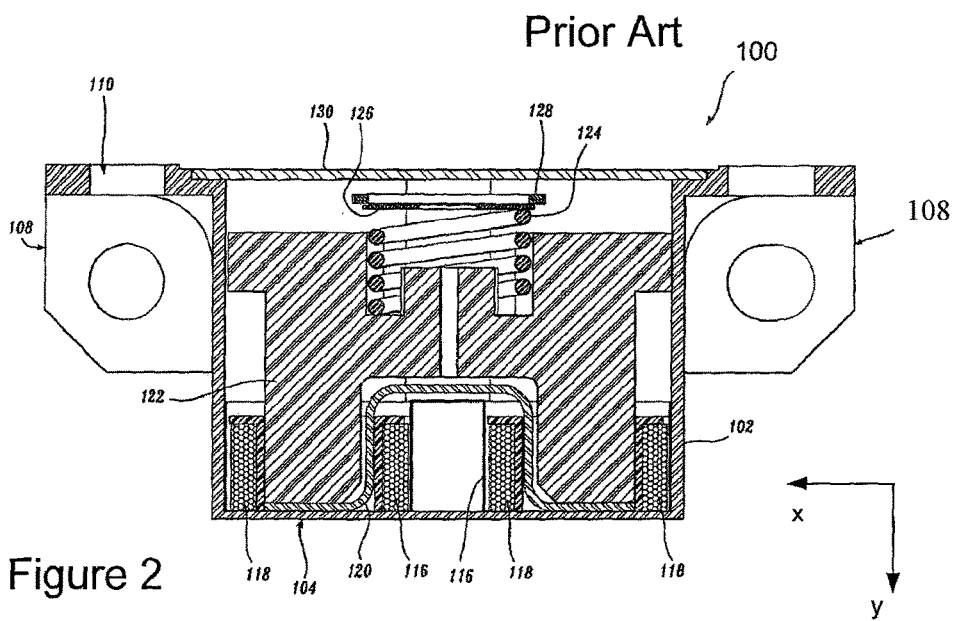
FIG. 2 shows the prior art proximity senor of FIG. 1 in a cross-section view.
Figure 3:
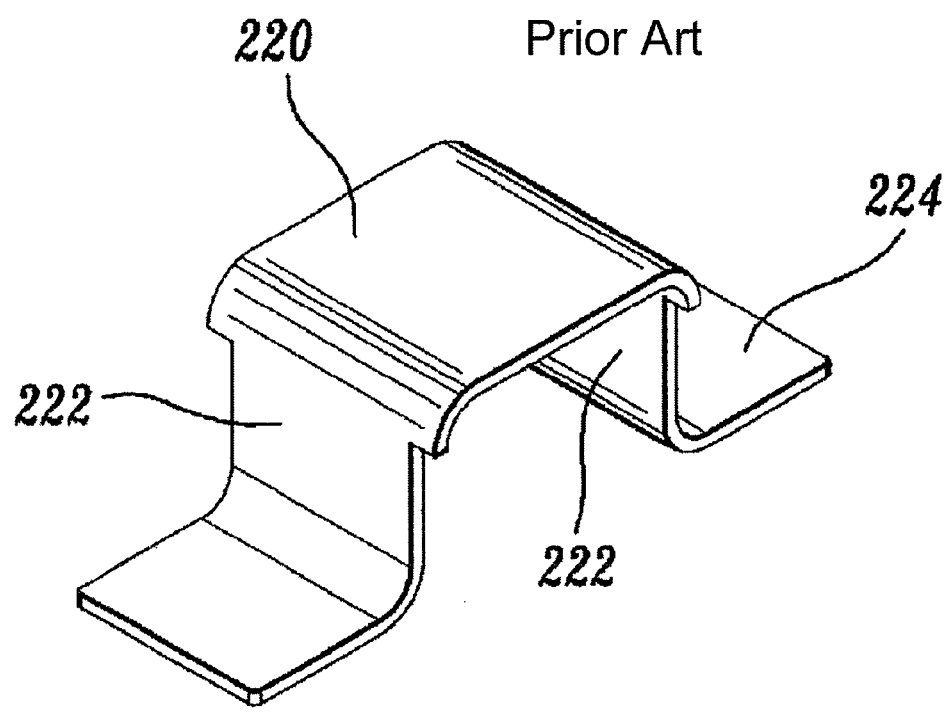
FIG. 3 shows the core of the prior art proximity sensor of FIG. 1.

With such an arrangement, the core can be fitted in a proximity sensor device package that is shorter in the y-axis (see FIG. 1). Alternatively, it allows longer leg portions (322) relative to other designs not having the head portions (320) bent over relative to the leg portions (322), which can help to reduce the flux linkage in the direction of the head portion (320). Flux linkage in that direction can reduce the sensitivity of the proximity sensor.

The core shown in FIG. 8b is substantially similar to that in FIG. 8a, only that the head portion (320) comprises one or more openings (340) for receiving a coil former or bobbin, which would extend through the openings (340) partially along the length of the leg portions (322) or along the whole of the leg portions (322) such that the coil former or bobbin would rest on the feet portions (324).

An alternative version of the arrangement of FIGS. 8a and 8b comprises only a third bend (330) between the head portion (320) and the leg portions (322), where the third bend is such that the head portion (320) extends generally perpendicular to the leg portions (322), and generally parallel to the foot portions (324).

Figure 9A:
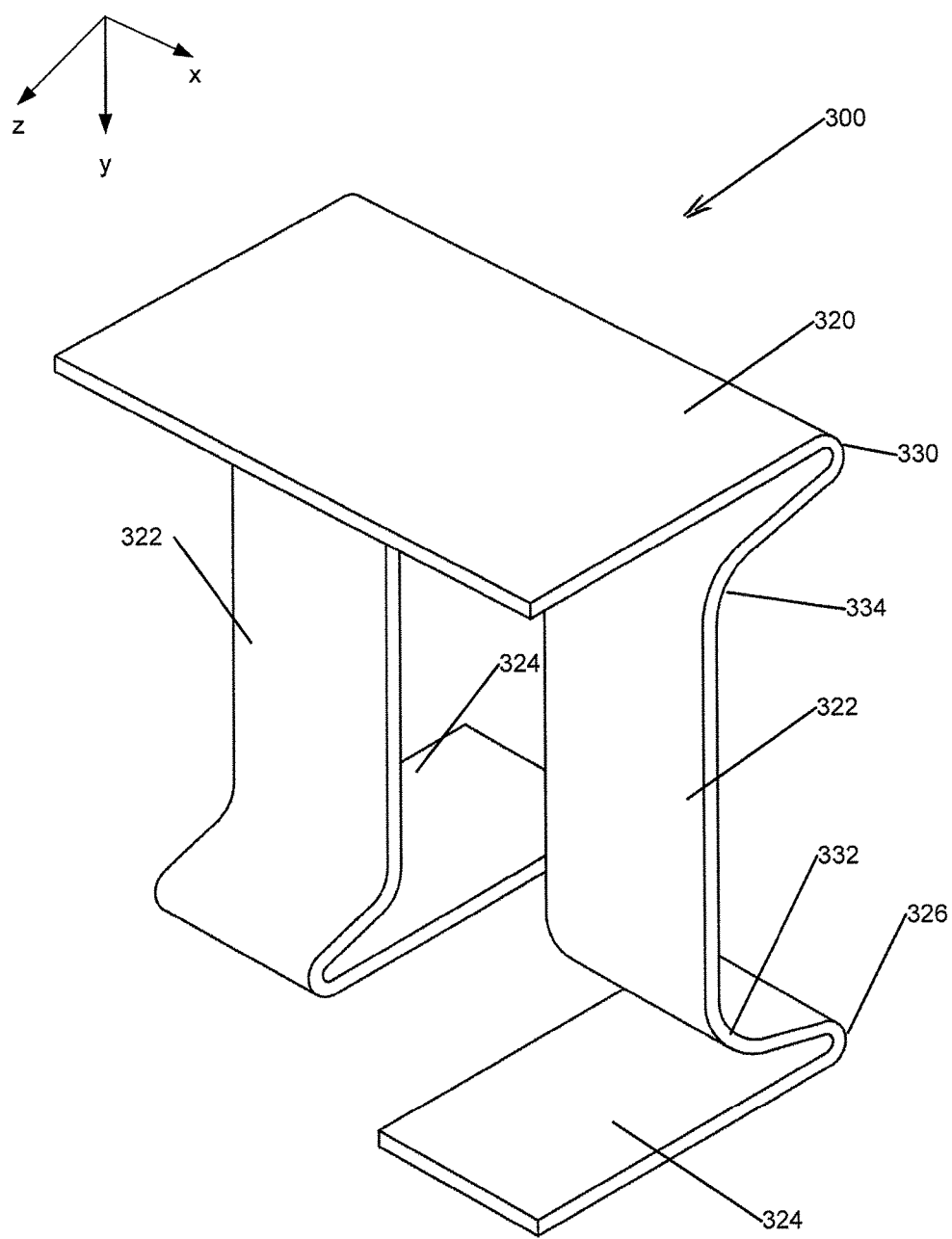
FIGS. 9a, 9b and 9c show the second proximity core design of FIG. 8 with a different configuration of the feet.
Figure 9B:
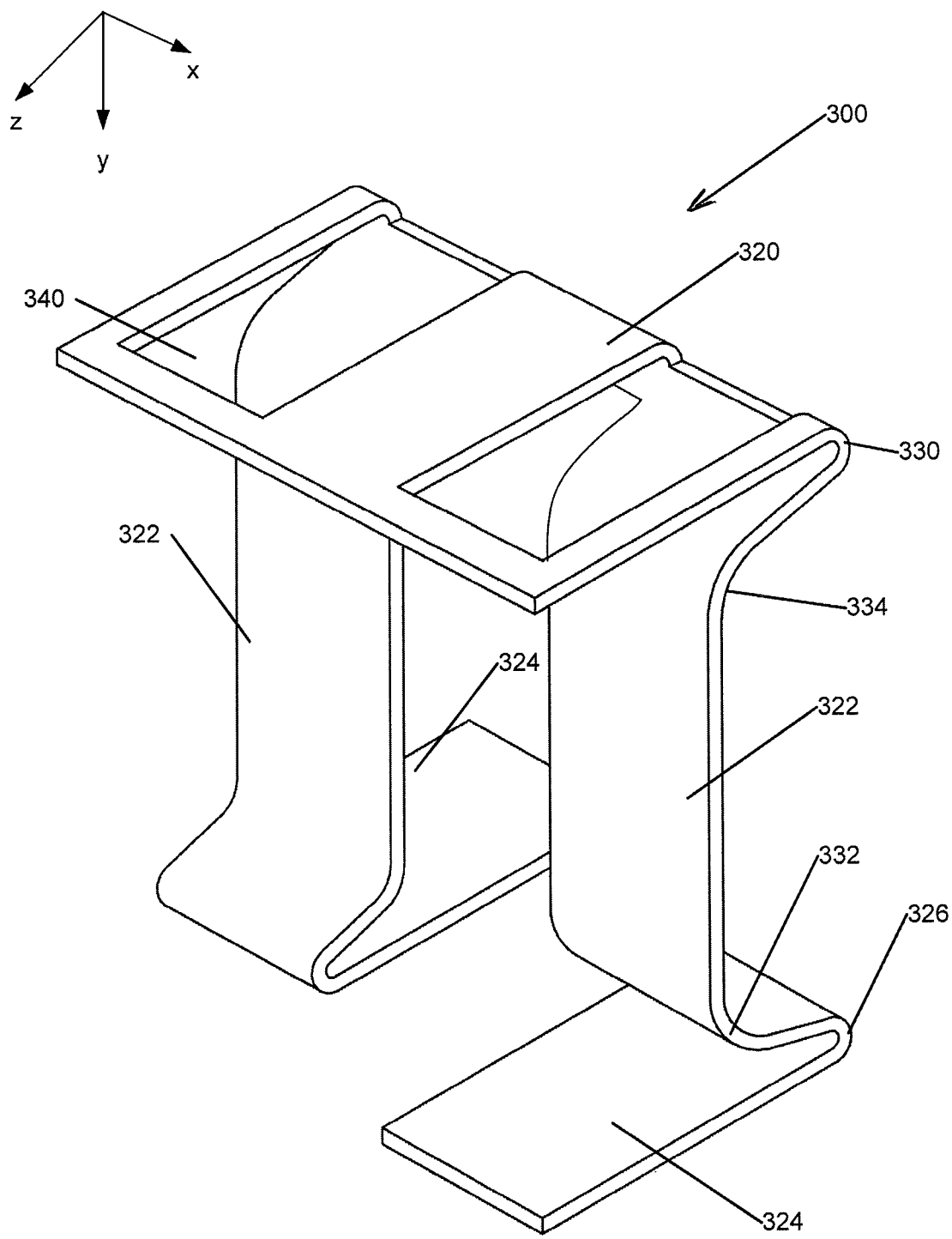
Figure 9C:
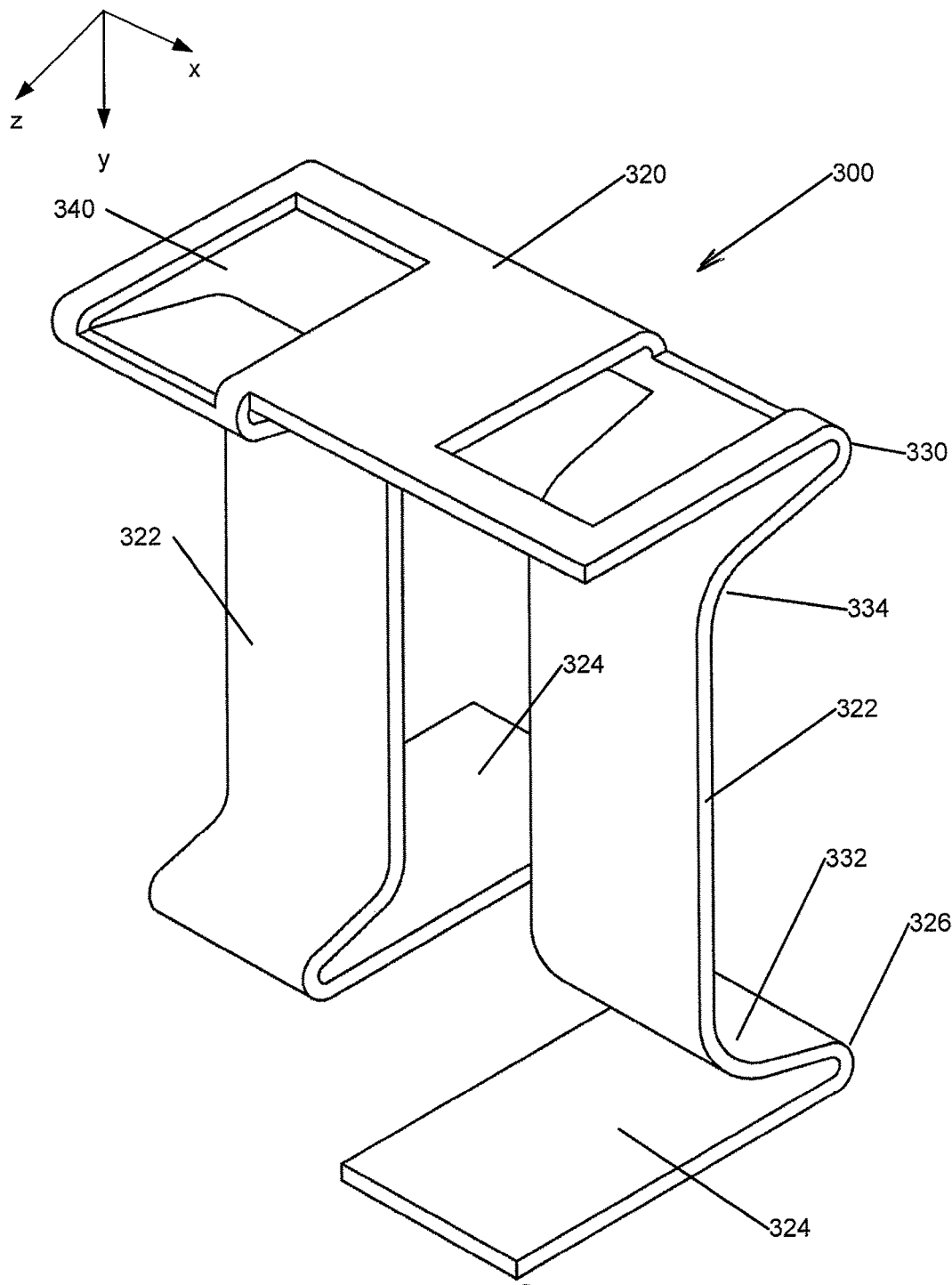

FIGS. 9a, 9b and 9c show an alternative version of the core of FIGS. 8a and 8b respectively. In the core shown in FIG. 9a, the head (320) and leg portions (322) are the same as in FIG. 8a. However, in FIG. 9a, the first and second foot portions (324) extend in directions that are parallel to each other, and approximately 180° apart from one another. FIG. 9b differs from FIG. 8b similarly. FIG. 9c is a modified version of FIG. 9b, in that one of the leg portions (322) extends from a different edge of the head portion (320) in order that the coil former or bobbin may rest on the flat portion of the foot portions (324).

Figure 10:
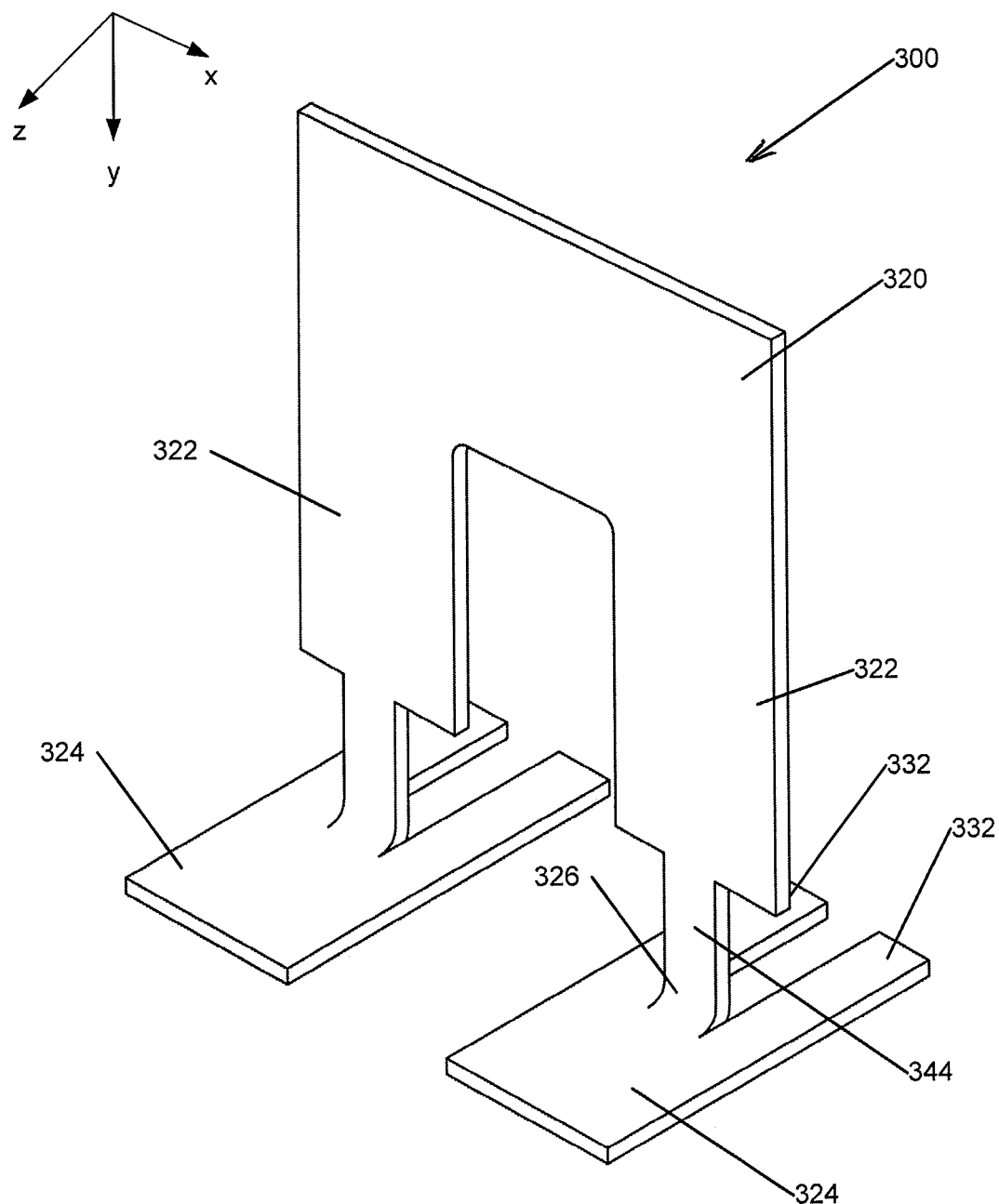
FIG. 10 shows a third proximity core design according to the invention.

FIG. 10 shows an alternative core design. In FIG. 10, the head portion (320) and upper leg portions (322) are the same as in FIG. 4. However, in FIG. 10, the first bend (326) and foot portions (324) differ to those of FIG. 4.

In FIG. 10, the first bend (326) is formed from a cut-out portion of the foot portion (324). During manufacture of the core, the foot portion (324) is stamped or cut to create the narrowed portion (344) and two prongs (332). The narrowed portion (344) is bent to create the first bend (326), which is arranged such that the leg portions (322) extend over and perpendicular to the foot portions (324).

During manufacture, the coils may be slipped over the foot portions (324) and leg portions (322) prior to the foot portions (324) being bent to form the first bend (326). In this process, the coils may be pushed up towards the head portion (320) to allow sufficient clearance for the foot portions (324) to be bent to form the first bend (326).

The narrowed portion (344) may be dimensioned to receive the coils more tightly than in designs in which the leg portion (322) extends down to the first bend (326), as in the above designs.

Figure 11:
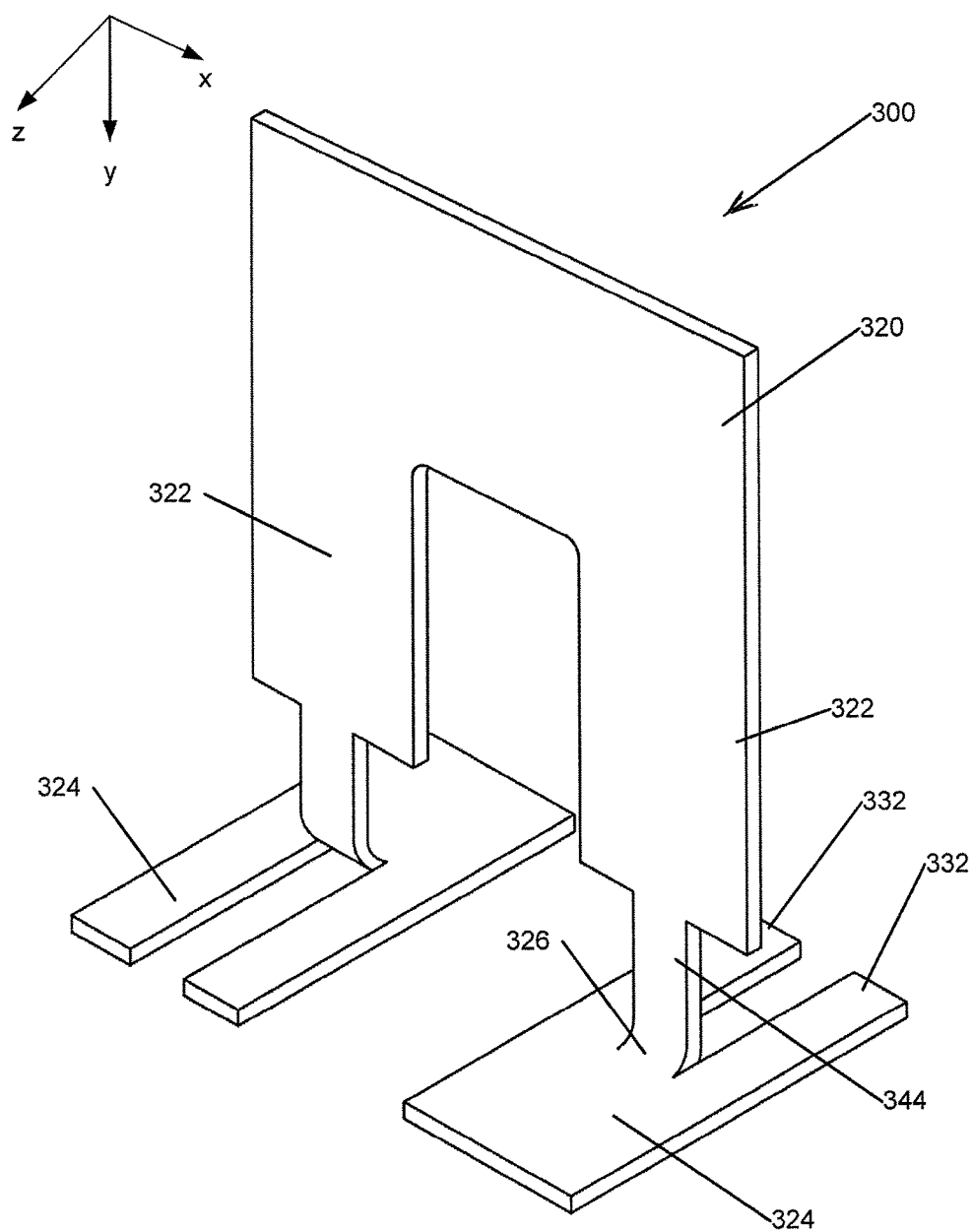
FIG. 11 shows the third proximity core design of FIG. 10 with a different configuration of the feet.

FIG. 11 shows an alternative version of the core of FIG. 10. In the core shown in FIG. 11, the head (320) and leg portions (322) are the same as in FIG. 10. However, in FIG. 11, the first and second foot portions (324) extend in directions that are parallel to each other, and approximately 180° apart from one another.

Figure 12A:
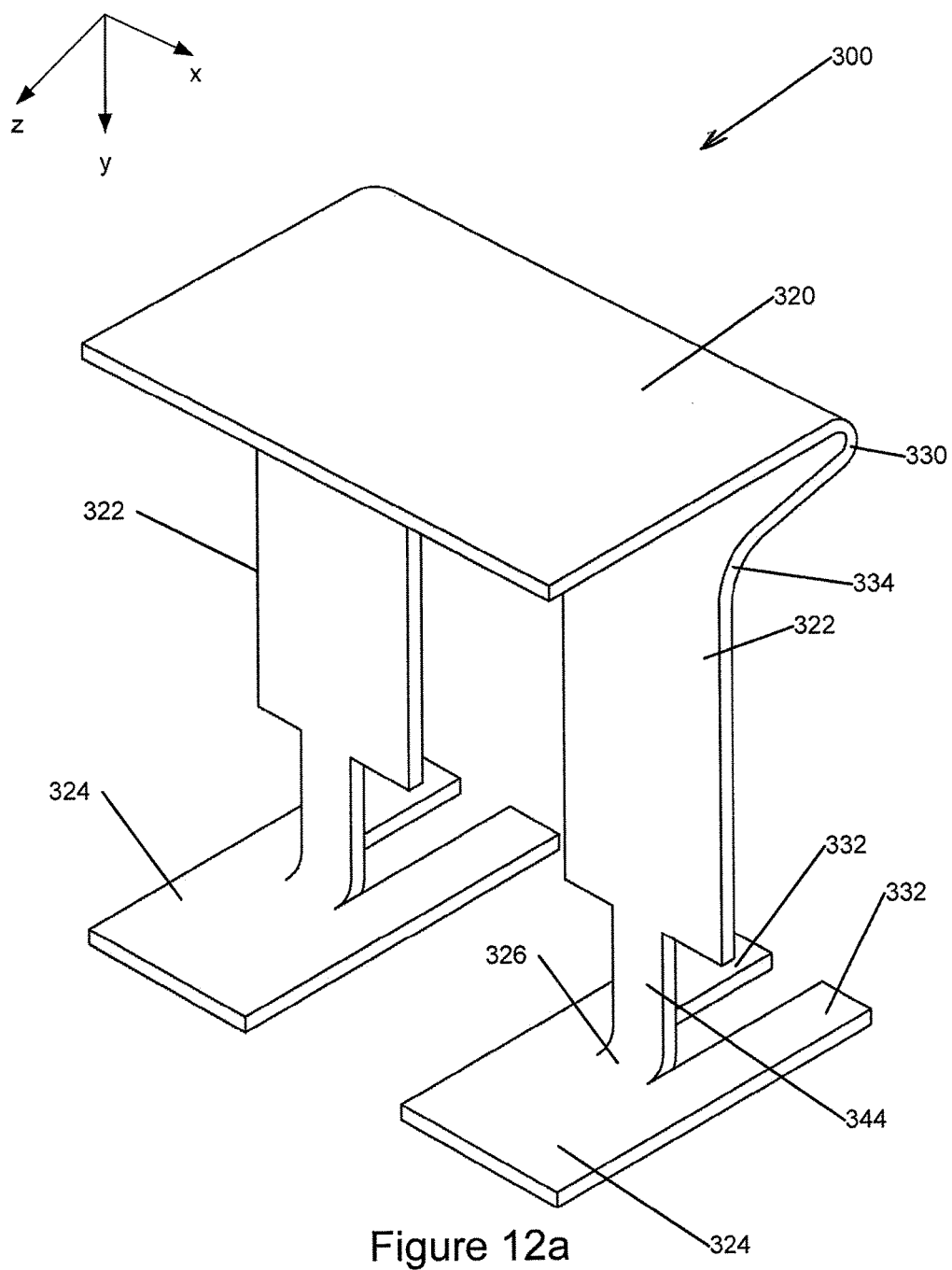
FIGS. 12a and 12b show the third proximity core design of FIG. 10 with a different head configuration.
Figure 12B:
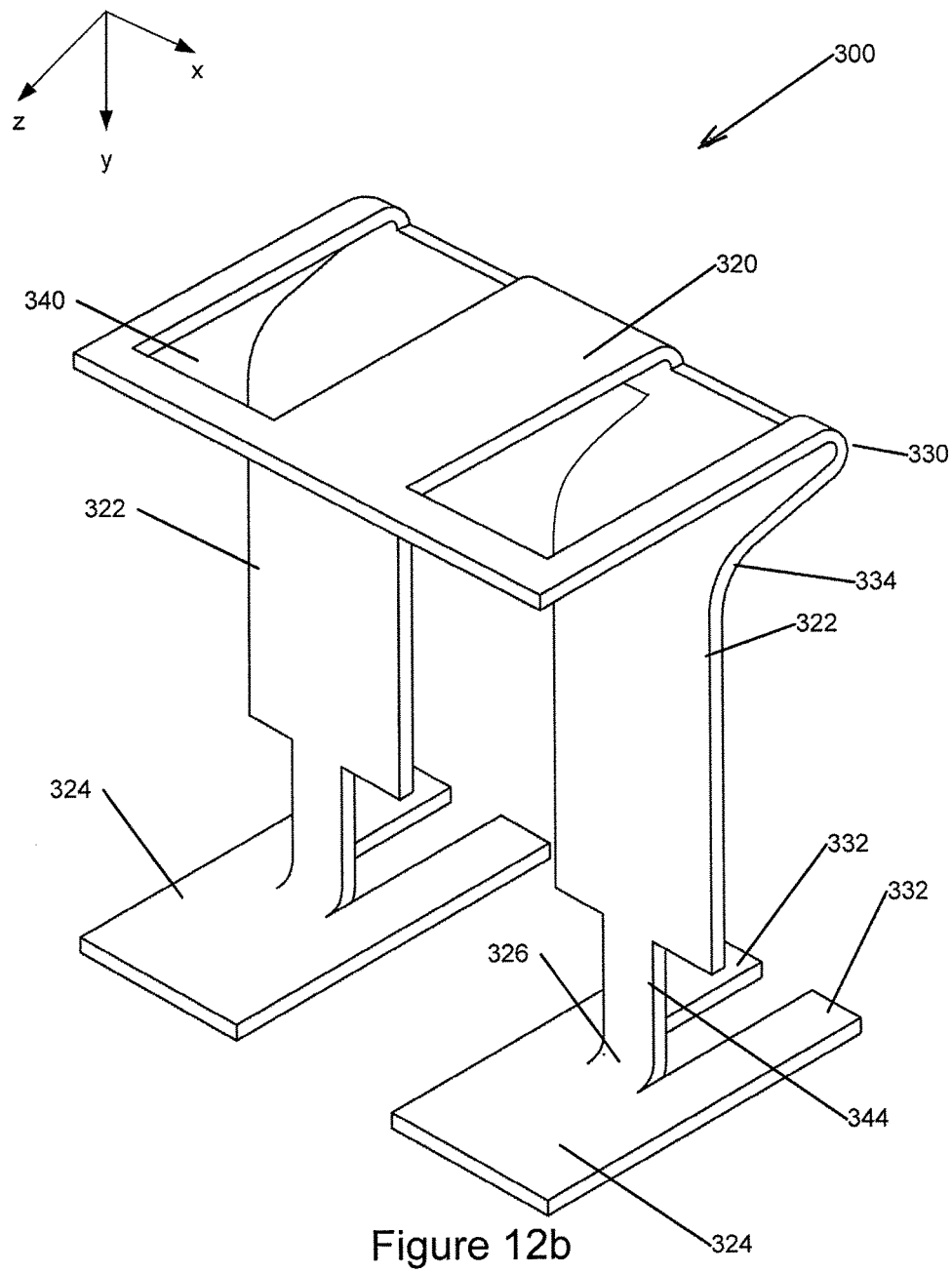

FIGS. 12a and 12b show an alternative version of the core of FIG. 10. In the core show in FIG. 12a, the core comprises a third bend (330) adjacent the head portion (320) and a fourth bend (334) between the third bend (330) and the leg portions (322). In this arrangement, the third bend (330) is at an obtuse angle, and the fourth bend (334) is at an acute angle. In this configuration, the head portion (320) extends along an axis that is generally perpendicular to the respective leg portions (322) (which extend beneath the head portion (320)), and generally parallel to and over at least a portion of one or both of the foot portions (324).

With such an arrangement, the core can be fitted in a proximity sensor device package that is shorter in the y-axis (see FIG. 1). Alternatively, it allows longer leg portions (322) relative to other designs not having the head portions (320) bent over relative to the leg portions (322), which can help to reduce the flux linkage in the direction of the head portion (320). Flux linkage in that direction can reduce the sensitivity of the proximity sensor.

The core shown in FIG. 12b is substantially similar to that in FIG. 12a, only that the head portion (320) comprises one or more openings (340) for receiving a coil former or bobbin.

An alternative version of the arrangement of FIGS. 12a and 12b comprise only a third bend (330) between the head portion (320) and the leg portions (322), where the third bend is such that the head portion (320) extends generally perpendicular to the leg portions (322), and generally parallel to the foot portions (324).

Figure 13A:
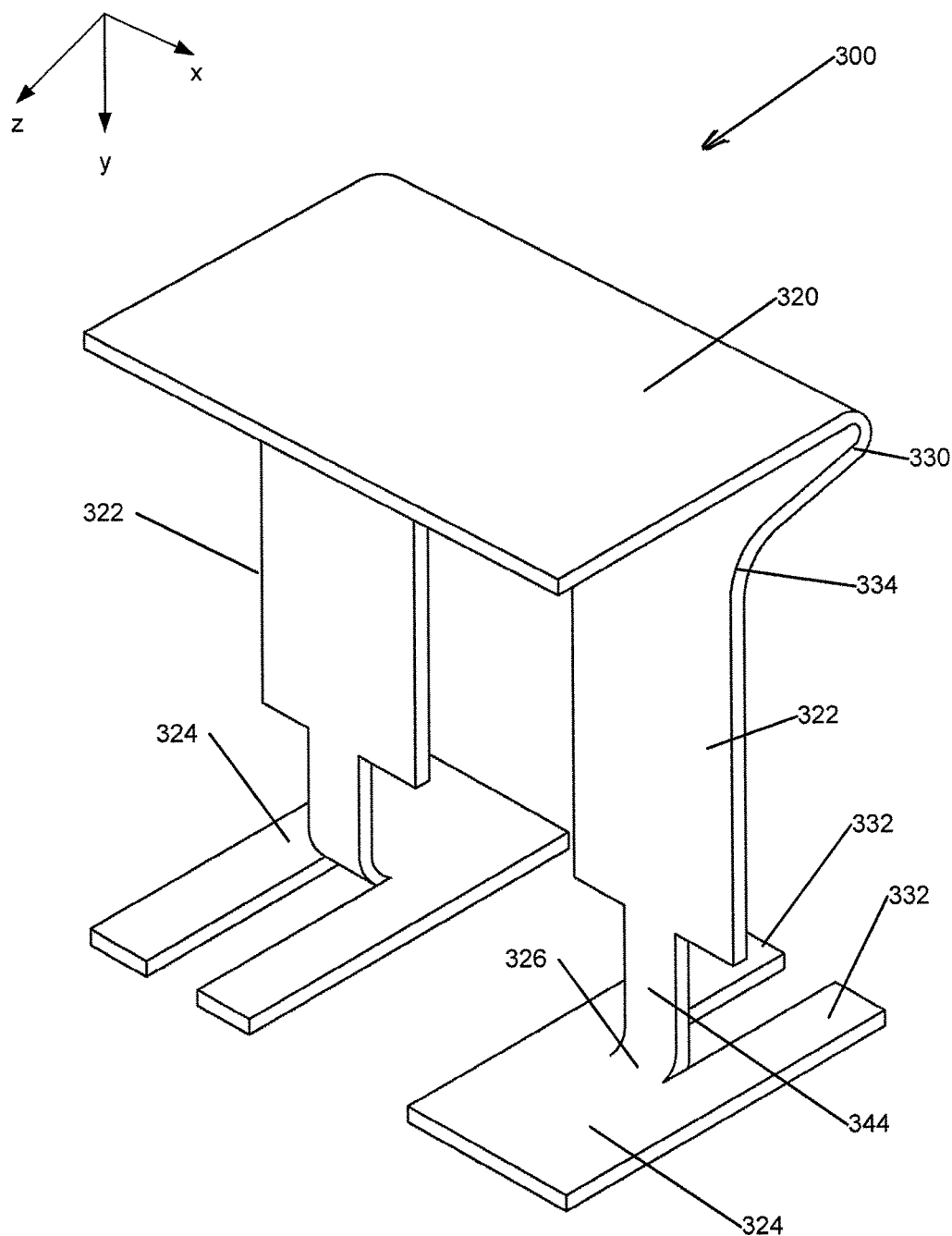
FIGS. 13a, 13b and 13c show the third proximity core design of FIG. 12 with a different configuration of the feet.
Figure 13B:
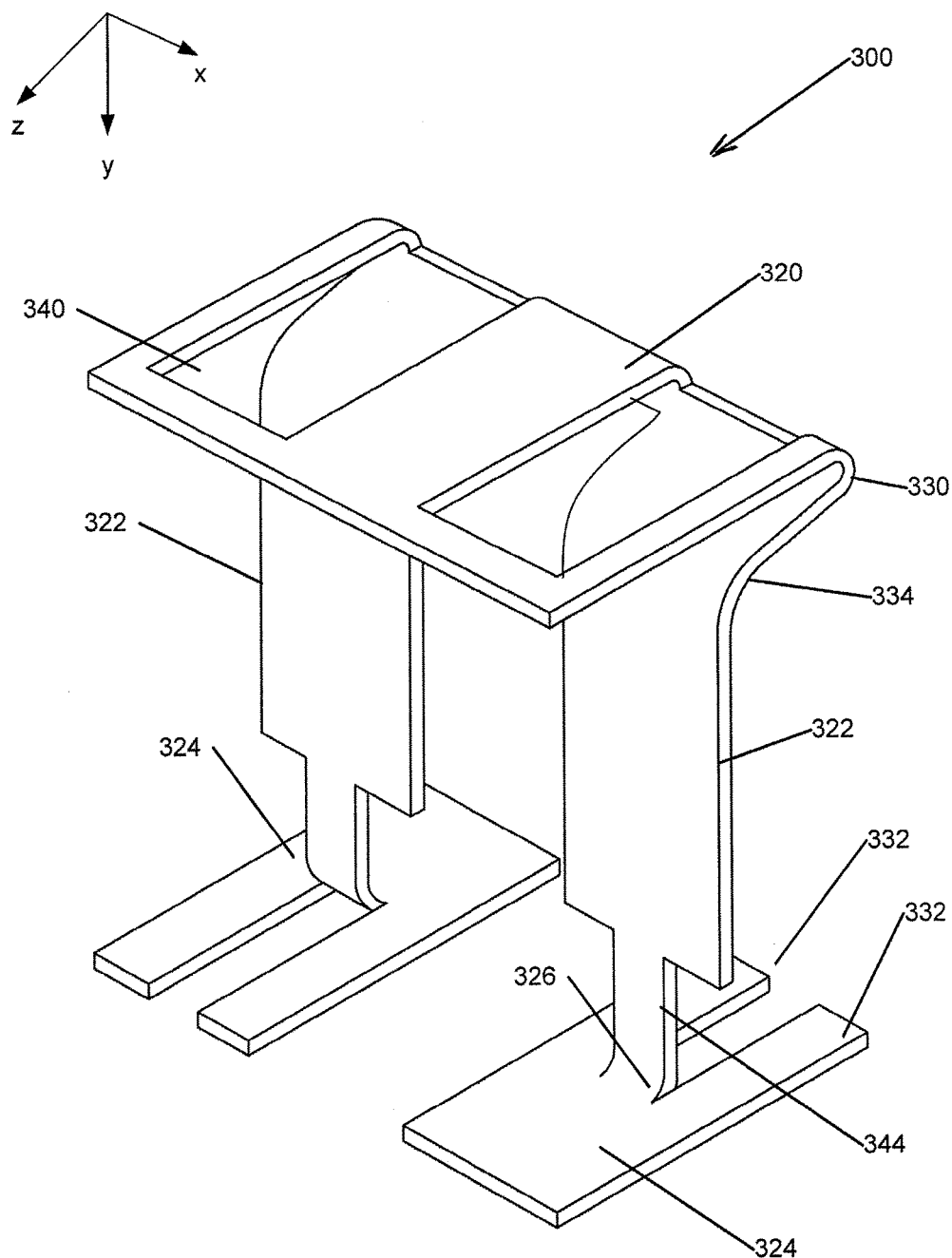
Figure 13C:
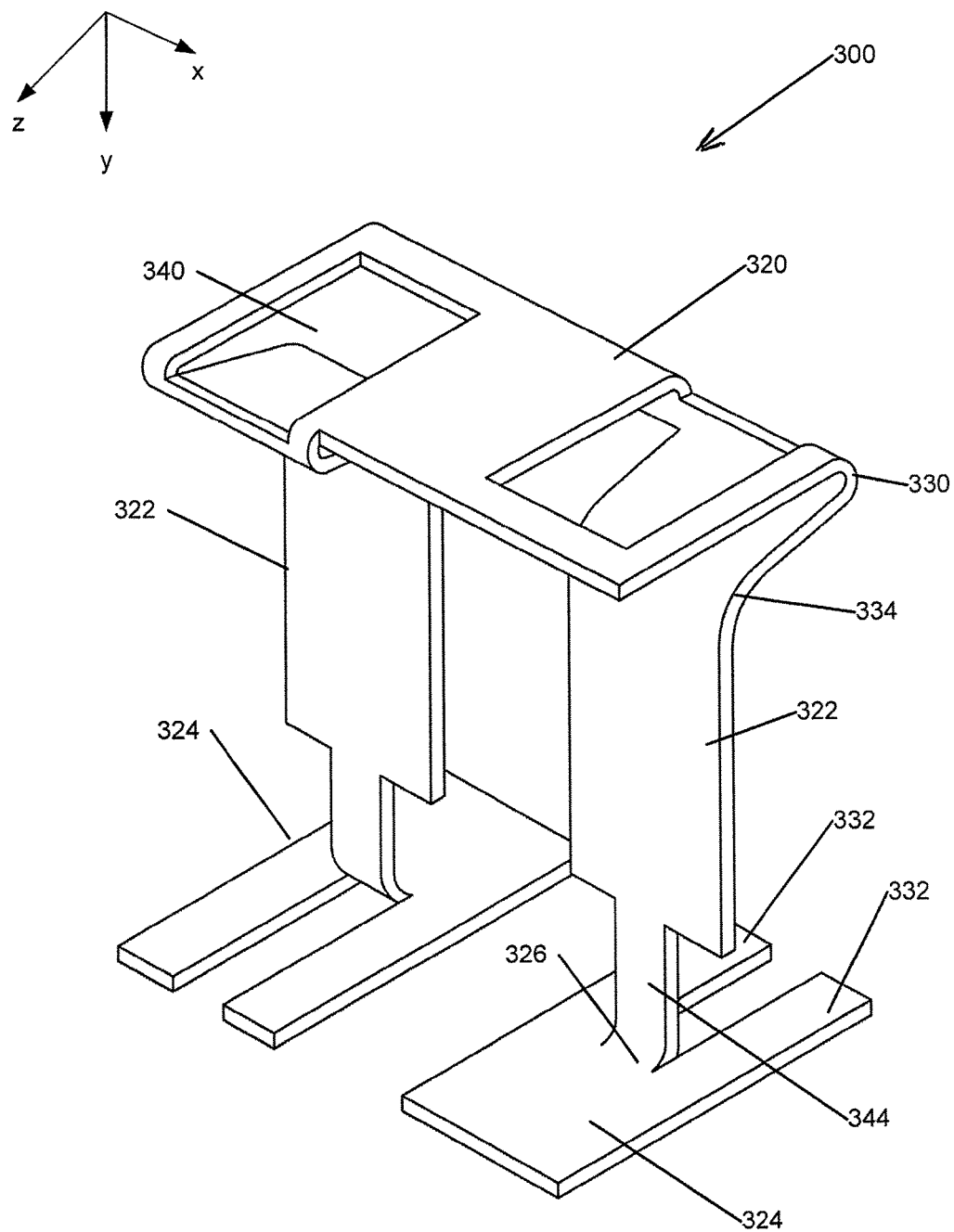
Figure 14:
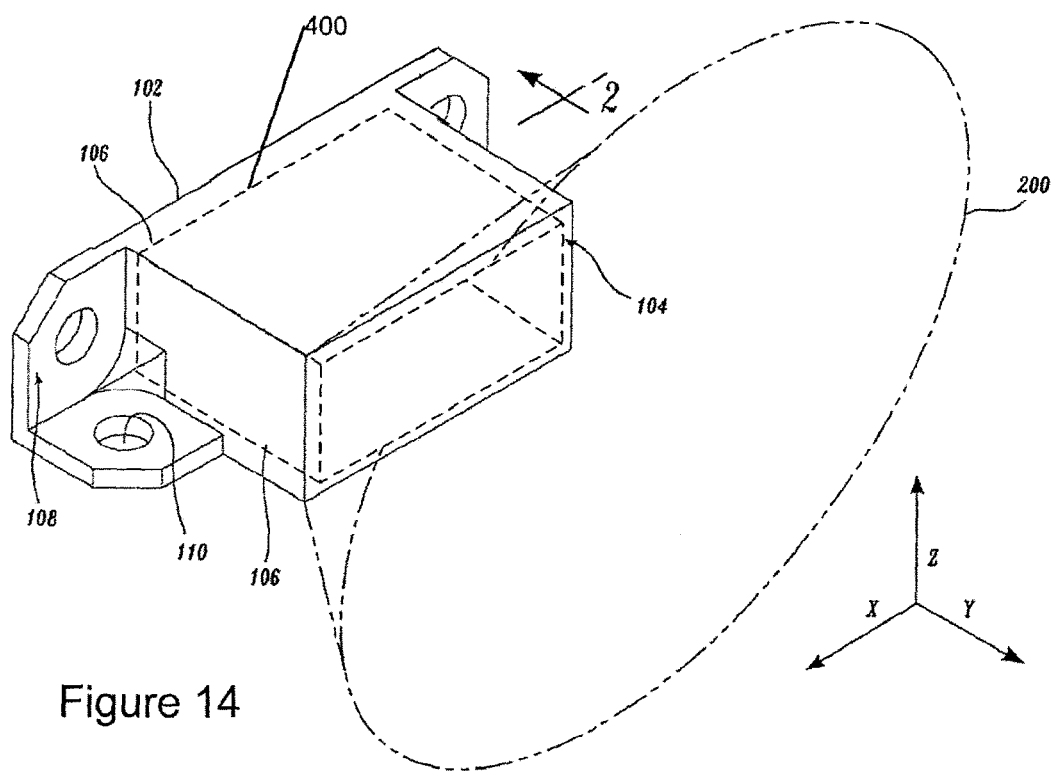
FIG. 14 shows a proximity sensor with a shield.
Figure 15:
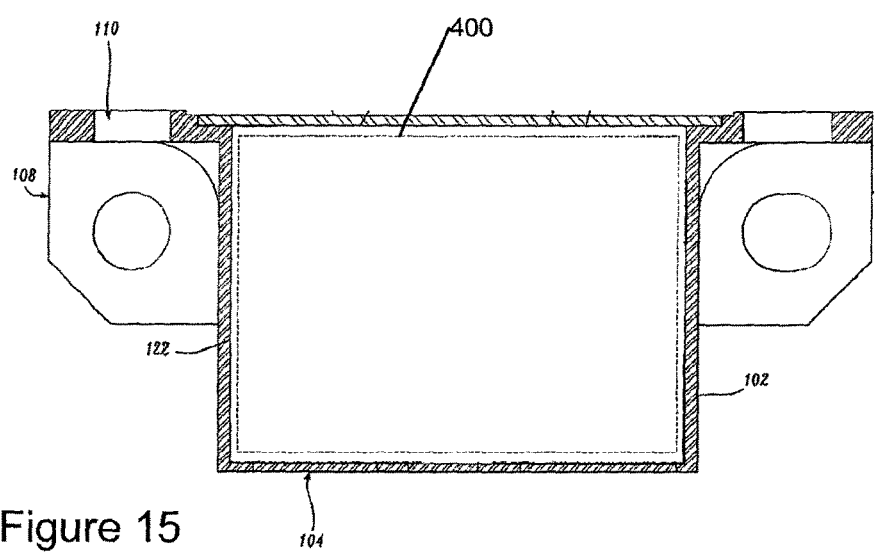
FIG. 15 shows the proximity sensor of FIG. 14 in a partial cross-section view.

FIGS. 13a, 13b and 13c show an alternative version of the core of FIGS. 12a and 12b respectively. In the core shown in FIG. 13a, the head (320) and leg portions (322) are the same as in FIG. 12a. However, in FIG. 13a, the first and second foot portions (324) extend in directions that are parallel to each other, and approximately 180° apart from one another. FIG. 13b differs from FIG. 12b similarly. FIG. 13c is a modified version of FIG. 13b, in that one of the leg portions (322) extends from a different edge of the head portion (320) in order that the coil former or bobbin may rest on the flat portion of the foot portions (324).

When the core (300) and coils are seated into a proximity sensor device package (for example the rectangular or cuboid package shown in FIG. 1, 2, 14 or 15), a shield (400) may be provided around portions of the core (300) in order to shield the core (300) from the effects of metal objects near to or approaching the proximity sensor from a side that is not the front sensor surface (104). The shield (400) may be provided across the whole or portions of one or more of the faces of the proximity sensor, except for the front sensor surface (104).

Without a shield (400) between the core (300) and the package of the proximity sensor device, the proximity sensor may be susceptible to the influence of metal objects, which may create a flux leakage from the core (300), which results in reduced sensitivity. The shield may be formed of a conductive metal, for example aluminium. In effect, the shield acts as a shorted turn in the magnetic field created by the core (300).

During manufacture, the shield (400) may be "tuned", that is have particular characteristics such that the performance of the proximity sensor device is tailored to a particular application. For example, the size, shape or position of the shield relative to the core (300) may be designed and adjusted during manufacturing in order to tune the proximity sensor performance to match a desired characteristic for a particular application.

In any of the above designs, one or more of the following dimensions may be applicable either in combination or in isolation:

The thickness of the sheet of relatively high permeability material may be 0.02" (0.51 mm)
  The fold or bend radius may be 1/16" (1.59 mm)
  Overall width of head may be 1" (25.4 mm)
  The space between legs may be 6/32" (4.76 mm)

In any of the above core designs, the width of the legs may be narrower than the width of the feet along the whole or a portion of the length of the leg portions. This is to provide additional space for the coils to be wound therearound the leg portions.

No doubt many other effective alternatives will occur to the skilled person. It will be understood that the invention is not limited to the described embodiments and encompasses modifications apparent to those skilled in the art lying within the scope of the claims appended hereto.

The invention claimed is:

1. A proximity sensor core for a proximity sensor for creating a magnetic field to sense a proximity of a target, the proximity sensor core comprising: a sheet of high relative permeability material having a thickness that is less than a width and length of the sheet of material, and the proximity sensor core comprising:

a head portion extending across a width of the sheet of material and having a first length;
   first and second leg portions extending a second length from a first edge of the head portion, each of the first and second leg portions extending across a portion of the width of the head portion; and
   first and second foot portions extending a third length from the respective first and second leg portions, the first and second foot portions having the same width as the respective leg portions, and the ends of the first and second foot portions being separated from each other by a gap,
   wherein the sheet of material comprises a first bend between each of the first and second foot portions and the respective first and second leg portions such that the first and second foot portions extend generally perpendicular to the respective first and second leg portions.

2. A proximity sensor core according to claim 1, wherein the first and second foot portions extend generally parallel to each other and 180° apart from one another.

3. A proximity sensor core according to claim 1, comprising a second bend between each of the respective first bends and the respective first and second legs, wherein the first bend is at an obtuse angle and the second bend is at an acute angle such that the respective first and second leg portions extend over and generally perpendicular to the respective first and second foot portions.

4. A proximity sensor core according to claim 1, wherein the first bend has a width that is narrower than the width of the respective first or second leg portions, and the first bend has a fourth length.

5. A proximity sensor core according to claim 4, wherein the first bend is formed from a cut-out portion of the respective first and second foot portions, the first bend extending from the respective first and second foot portion such that the respective first and second leg portions extend over and generally perpendicular to the respective first and second foot portions.

6. A proximity sensor core according to claim 4, wherein the cut-out in the first and second foot portions to provide the first bend defines a gap between two end portions in each of the first and second foot portions.

7. A proximity sensor core according to claim 1, wherein each of the first bends of each of the first and second leg portions are adapted to receive a respective coil wound there-around for generating a magnetic field when a current is passed there-through.

8. A proximity sensor core according to claim 1, wherein the width of the leg portions narrows along at least a portion of the second length.

9. A proximity sensor core according to claim 1, wherein the sheet of material comprises a third bend between each of the first and second leg portions and the head portion such that the head portion extends along an axis that is generally perpendicular to the respective first and second leg portions.

10. A proximity sensor core according to claim 9, wherein the head extends generally parallel to and over at least a portion of one or both of the foot portions.

11. A proximity sensor core according to claim 9, comprising a fourth bend between each of the respective third bends and the respective first and second legs, wherein the third bend is at an obtuse angle and the fourth bend is at an acute angle such that the respective first and second leg portions extend beneath and generally perpendicular to the head portion.

12. A proximity sensor core according to claim 9, wherein the head portion comprises one or more openings for receiving a coil former or bobbin.

13. A proximity sensor core according to claim 1, wherein each of the lower portions of each of the first and second leg portions are adapted to receive a respective coil wound there-around for generating a magnetic field when a current is passed there-through.

14. A proximity sensor for sensing the proximity of a target, the proximity sensor comprising:
   a case having a flat rectangular sensor face, side walls and a lid; and
   a proximity sensor core for creating a magnetic field for sensing a proximity of a target, the proximity sensor core being located inside the case, the proximity sensor core comprising: a sheet of high relative permeability material having a thickness that is less than a width and length of the sheet of material, and the core comprising:
   a head portion extending across a width of the sheet of material and having a first length;
   first and second leg portions extending a second length from a first edge of the head portion, each of the first and second leg portions extending across a portion of the width of the head portion; and
   first and second foot portions extending a third length from the respective first and second leg portions, the first and second foot portions having the same width as the respective leg portions, and the ends of the first and second foot portions being separated from each other by a gap;
   wherein the sheet of material comprises a first bend between each of the first and second foot portions and the respective first and second leg portions such that the first and second foot portions extend generally perpendicular to the respective first and second leg portions, and
   wherein the first and second foot portions of the sensor core are adjacent the inside surface of the flat rectangular sensor face and arranged to extend transverse the shorter dimension of the rectangular sensor face.

15. A proximity sensor according to claim 14, comprising a first and second plurality of coils wound around respective first bends of the respective first and second leg portions.

16. A proximity sensor according to claim 14, comprising a conductive shield arranged to shield one or more sides of the case except for the rectangular sensor face.

17. A proximity sensor according to claim 14, wherein the sensor is a proximity sensor.

18. A proximity sensor according to claim 14, wherein the first and second foot portions extend generally parallel to each other and 180° apart from one another.

19. A proximity sensor according to claim 14, comprising a second bend between each of the respective first bends and the respective first and second legs, wherein the first bend is at an obtuse angle and the second bend is at an acute angle such that the respective first and second leg portions extend over and generally perpendicular to the respective first and second foot portions.

20. A proximity sensor according to claim 14, wherein the first bend has a width that is narrower than the width of the respective first or second leg portions, and the first bend has a fourth length.

21. A proximity sensor according to claim 20, wherein the first bend is formed from a cut-out portion of the respective first and second foot portions, the first bend extending from the respective first and second foot portion such that the respective first and second leg portions extend over and generally perpendicular to the respective first and second foot portions.

22. A proximity sensor according to claim 20, wherein the cut-out in the first and second foot portions to provide the first bend defines a gap between two end portions in each of the first and second foot portions.

23. A proximity sensor according to claim 14, wherein each of the first bends of each of the first and second leg portions are adapted to receive a respective coil wound there-around for generating a magnetic field when a current is passed there-through.

24. A proximity sensor according to claim 14, wherein the width of the leg portions narrows along at least a portion of the second length.

25. A proximity sensor according to claim 14, wherein the sheet of material comprises a third bend between each of the first and second leg portions and the head portion such that the head portion extends along an axis that is generally perpendicular to the respective first and second leg portions.

26. A proximity sensor according to claim 25, wherein the head extends generally parallel to and over at least a portion of one or both of the foot portions.

27. A proximity sensor according to claim 25, comprising a fourth bend between each of the respective third bends and the respective first and second legs, wherein the third bend is at an obtuse angle and the fourth bend is at an acute angle such that the respective first and second leg portions extend beneath and generally perpendicular to the head portion.

28. A proximity sensor core according to claim 25, wherein the head portion comprises one or more openings for receiving a coil former or bobbin.

29. A proximity sensor according to claim 14, comprising a first and second plurality of coils wound around respective lower portions of the respective first and second leg portions.

30. A proximity sensor according to claim 14, wherein each of the lower portions of each of the first and second leg portions are adapted to receive a respective coil wound there-around for generating a magnetic field when a current is passed there-through.

* * * * *